United States Patent
Kim

(10) Patent No.: US 7,555,280 B2
(45) Date of Patent: Jun. 30, 2009

(54) APPARATUS FOR FREQUENCY DIRECT CONVERSION RECEPTION IN MOBILE COMMUNICATION TERMINAL AND METHOD THEREOF

(75) Inventor: Sang Won Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 432 days.

(21) Appl. No.: 11/295,061

(22) Filed: Dec. 6, 2005

(65) Prior Publication Data

US 2006/0121871 A1 Jun. 8, 2006

(30) Foreign Application Priority Data

Dec. 7, 2004 (KR) .................. 10-2004-0102440

(51) Int. Cl.
*H04B 1/26* (2006.01)
*H04B 15/00* (2006.01)

(52) U.S. Cl. .................. 455/313; 455/285; 455/318; 455/326

(58) Field of Classification Search ......... 455/283–285, 455/295, 296, 302–305, 310, 313–326, 333
See application file for complete search history.

(56) References Cited

U.S. PATENT DOCUMENTS

| | | | | |
|---|---|---|---|---|
| 4,308,473 A * | 12/1981 | Carnes | ........................ | 327/113 |
| 6,073,001 A * | 6/2000 | Sokoler | ........................ | 455/323 |
| 6,510,314 B1 * | 1/2003 | Kuo | ........................ | 455/326 |
| 6,694,129 B2 * | 2/2004 | Peterzell et al. | ........................ | 455/76 |
| 6,711,397 B1 * | 3/2004 | Petrov et al. | ........................ | 455/324 |
| 7,003,263 B2 * | 2/2006 | Fischer et al. | ........................ | 455/63.1 |
| 7,035,615 B2 * | 4/2006 | Kim et al. | ........................ | 455/317 |
| 7,054,610 B1 * | 5/2006 | Itoh et al. | ........................ | 455/324 |
| 2002/0155822 A1 * | 10/2002 | Adachi | ........................ | 455/293 |
| 2003/0078020 A1 * | 4/2003 | Kintis | ........................ | 455/209 |
| 2003/0109238 A1 | 6/2003 | Kim et al. | | |
| 2004/0063418 A1 * | 4/2004 | Kluge et al. | ........................ | 455/315 |
| 2008/0051051 A1 * | 2/2008 | Kral | ........................ | 455/264 |

FOREIGN PATENT DOCUMENTS

CN 1266554 9/2000

* cited by examiner

*Primary Examiner*—Simon D Nguyen
(74) *Attorney, Agent, or Firm*—Workman Nydegger

(57) ABSTRACT

An apparatus for frequency direct conversion reception in a mobile communication terminal and method thereof are disclosed, by which a DC offset can be removed. The present invention includes a power distributor configured to distribute a radio frequency input signal into two signals having 180° phase differences, an equal phase directionality coupler configured to receive a single local signal provided by a local oscillator in order to distribute the single local signal into two output signals having the same phase, a pair of mixers, each configured to mix one of the two distributed local signals with one of the two distributed radio frequency signals in order to output a signal in downlink centering on a DC, a pair of baseband gain buffer amplifiers, each configured to deliver without load effect one of the two signals outputted from each of the pair of mixers to a rear end of the apparatus, a pair of pass filters, each configured to allow only low frequency band signals of the signals output by the pair of baseband gain buffer amplifiers to pass through, and a low frequency subtraction circuit configured to receive and compare the size of the signals that pass through the pair of pass filters.

11 Claims, 3 Drawing Sheets

(A)  0V (Smo1)  0V $V_{DC}$ (Smo2)  0V $V_{DC}$ (D)  0V

APPARATUS FOR FREQUENCY DIRECT CONVERSION RECEPTION IN MOBILE COMMUNICATION TERMINAL AND METHOD THEREOF

CROSS REFERENCE TO RELATED APPLICATIONS

This United States Patent Application claims the benefit of the Korean Patent Application No. 10-2004-0102440, filed on Dec. 7, 2004, which is hereby incorporated by reference as if fully set forth herein.

BACKGROUND OF THE INVENTION

1. The Field of the Invention

The present invention relates to a frequency direct-conversion receiving apparatus, and more particularly, to an apparatus for frequency direct conversion reception in a mobile communication terminal and method thereof. Although the present invention is suitable for a wide scope of applications, it is particularly suitable for removing a DC offset and for reducing a leakage power of a local oscillator.

2. Discussion of the Related Art

Generally, a zero intermediate frequency receiver has an intermediate frequency (IF) of 0 Hz and implements a frequency direct conversion system that does not use an intermediate frequency. A frequency direct conversion, also known as a direct conversion system, differs from the widely used super-heterodyne system. Specifically, in a direct conversion system, a high-frequency carrier signal is converted into a low-frequency baseband signal directly without using an intermediate frequency (IF).

FIG. 1 is a block diagram of a zero intermediate frequency receiver. Referring to FIG. 1, a zero intermediate frequency receiver includes an antenna 1 configured to receive radio waves, a band select filter 2 configured to filter the radio waves received via the antenna 1 according to an input reception band, a low noise amplifier (LNA) 3 configured to amplify a received signal with a sufficient gain, an image reject filter configured to filter an image signal working as a noise from the signal amplified by the low noise amplifier 3, a mixer 5 configured to mix the signal provided through the image reject filter 4 and the signal provided from a local oscillator (LO) 7, and a low pass filter 6 through which the output signal of the mixer 5 passes prior to arriving at a baseband processor (not shown).

Where direct conversion is employed, the corresponding configuration is simpler than a super-heterodyne system since there is no intermediate frequency. Various surface acoustic wave (SAW) filters and mixers and the like can therefore be eliminated. Hence, direct conversion is advantageous in achieving a low cost, lightweight, one-chip system. Many efforts have been made to research and develop direct conversion techniques that are applicable to mobile communications in order to improve direct conversion for systems such as the Global System for Mobile communication (GSM).

Direct conversion, which is advantageous in achieving a low cost system with few components, does have some drawbacks when compared to systems using an intermediate frequency (IF). For example, applications using direct conversion may be limited to standard frequencies and systems. Also, direct conversion frequently generates an undesirable DC offset. This undesirable generation of a DC offset has several causes. First, an undesirable DC offset can occur in the output of a mixer due to self-mixing. Self-mixing occurs when a leaked signal of a local oscillator is inadvertently input into a mixer via an unintended path. Second, an undesirable DC offset can occur when a leaked signal of a local oscillator is inadvertently input into a low noise amplifier. When this occurs, the low noise amplifier produces a signal that includes a DC offset. Third, an undesirable DC offset can occur when a radio wave transmitted via an antenna is reflected back, and a noise is generated when the radio wave is converted to a baseband signal. Also, the leaked signal of a local oscillator (LO) is generated from bonding wire radiation, magnetic coupling, ground instability and the like.

Since direct conversion converts a radio signal directly into a baseband signal, gain and filtering are mostly carried out on a frequency band between DC and signal bandwidth. In doing so, a unique DC offset of a signal path is extended to degrade the operational range of a circuit. Hence, a DC offset, which is a disadvantage of a zero intermediate frequency receiver, needs to be compensated for in order to achieve optimal radio performance.

SUMMARY OF THE INVENTION

Accordingly, the present invention is directed to an apparatus for frequency direct conversion reception in a mobile communication terminal and method thereof that substantially obviate one or more problems due to limitations and disadvantages of the related art.

An object of the present invention is to provide an apparatus for frequency direct conversion reception in a mobile communication terminal and method thereof, by which a DC offset can be removed.

Another object of the present invention is to provide an apparatus for frequency direct conversion reception in a mobile communication terminal and method thereof, by which the amount of power leakage of a local oscillator can be reduced to an amount that is relatively less than the amount of power leakage of a general direct downlink conversion mixer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In a preferred embodiment of an apparatus for frequency direct conversion reception in a mobile communication terminal is characterized by converting a carrier to a baseband carrying real information directly without using an intermediate frequency (IF) or by converting a low frequency band signal of a baseband to a radio frequency that is transmitted/received as a radio wave.

To achieve these objects and other advantages and in accordance with the purpose of the invention, as embodied and broadly described herein, in directly converting a carrier signal to a baseband frequency, a method of converting a reception frequency in a mobile communication terminal according to the present invention includes reducing a second order distortion and a DC offset and reducing a leakage amount of local oscillation power.

Preferably, the second order distortion and the DC offset are reduced by applying a divided carrier signal to each of two double balanced mixers, where each divided carrier signal is generated by dividing the carrier signal into two signals having 180° phase differences from each other.

In another aspect of the present invention, a method of frequency direct conversion in a mobile communication terminal includes a radio frequency distributing step of distributing an RF input signal into two signals having 180° phase differences from each other by coupling, a local signal distributing step of distributing a local signal provided from a local oscillator into two signals having the same phase, a signal mixing step of mixing the distributed RF signals with the distributed local signals, an amplifying step of amplifying each of the mixed signals, a frequency band filtering step of allowing only a low frequency band signal from each of the amplified signals to pass through, and a canceling & adding step of canceling out DC offsets included in the filtered signals and adding a wanted signal.

Preferably, the local signal distributing step includes the step of finitely adjusting the phase and power level of the distributed signals according to a control signal.

More preferably, the signal mixing step includes the step of mixing the two distributed radio frequency signals and the two distributed local signals in order to convert in downlink centering on a DC.

In another aspect of the present invention, an apparatus for frequency direct conversion reception in a mobile communication terminal includes a power distributor configured to distribute a single radio frequency (RF) input signal into two output signals having 180° phase differences by coupling. An equal phase directionality coupler is configured to receive a local signal provided by a local oscillator in order to distribute the single local signal into two output signals having the same phase. Further, a pair of mixers are provided, each configured to mix one of the two distributed local signals with one of the two distributed radio frequency signals applied via the power distributor in order to output a signal in downlink centering on a DC. A pair of baseband gain buffer amplifiers are also provided, each configured to deliver without load effect one of the two signals outputted from each of the pair of mixers to a rear end of the apparatus. Further, a pair of low pass filters, each configured to allow only low frequency band signals of signals output by the pair of baseband gain buffer amplifiers to pass through are provided. Finally, a low frequency subtraction circuit is configured to receive and compare the size of the signals that pass through the pair of pass filters.

In one presently preferred embodiment, the power distributor is a ring hybrid, and each of the pair of mixers is implemented as a double balanced mixer.

Preferably, a pair of correction circuits, each configured to adjust one of the two output signals of the equal phase directionality coupler before each of the two output signals are delivered to each of the pair of mixers, is connected to the equal phase directionality coupler.

More preferably, each of the pair of correction circuits includes a variable phase converter configured to convert a phase of the signal output by the equal phase directionality coupler according to a control signal. Also, a variable attenuator is preferably configured to adjust a power level of the signal converted by the variable phase converter in order to cope with a rear end circuit according to the control signal.

Preferably, the output signals of the pair of the mixers are substantially equal to each other in size of DC offset, and are substantially opposite to each other in phase.

Also, in preferred embodiments the low frequency subtraction circuit includes an operational amplifier or a transformer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
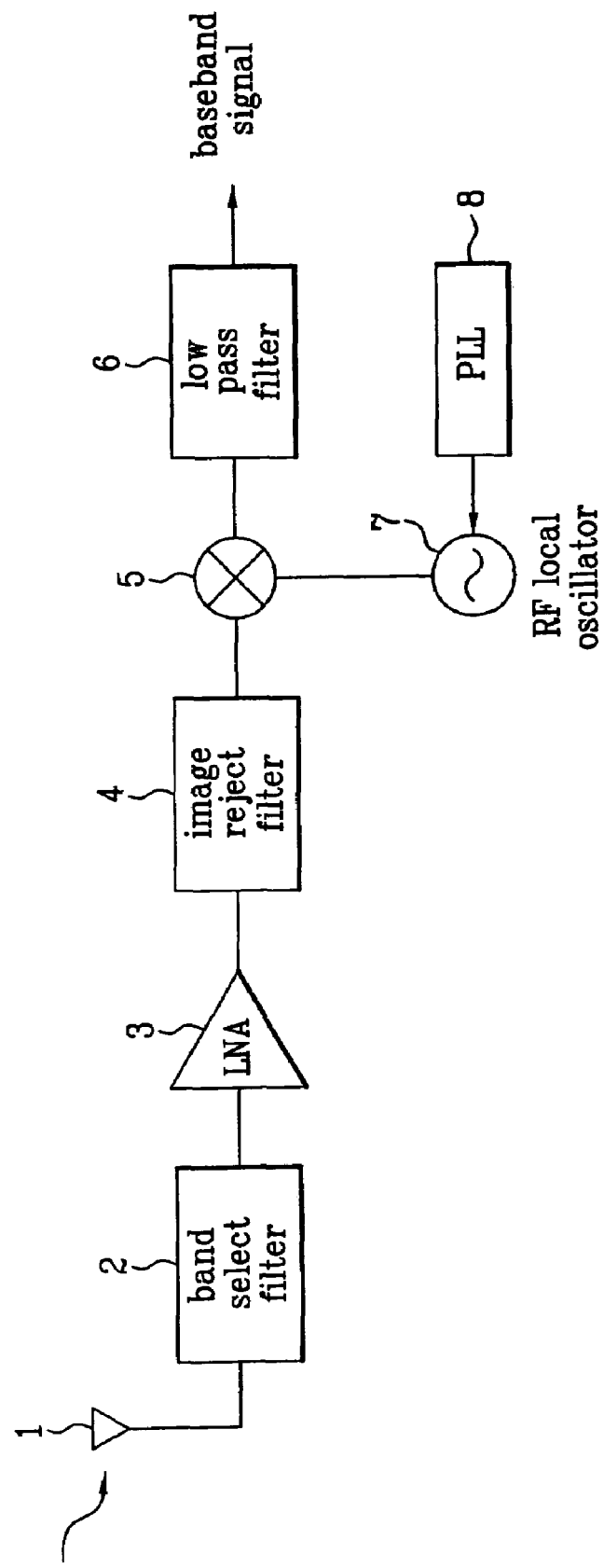
FIG. 1 is a block diagram of a zero intermediate frequency receiver.
Figure 2:
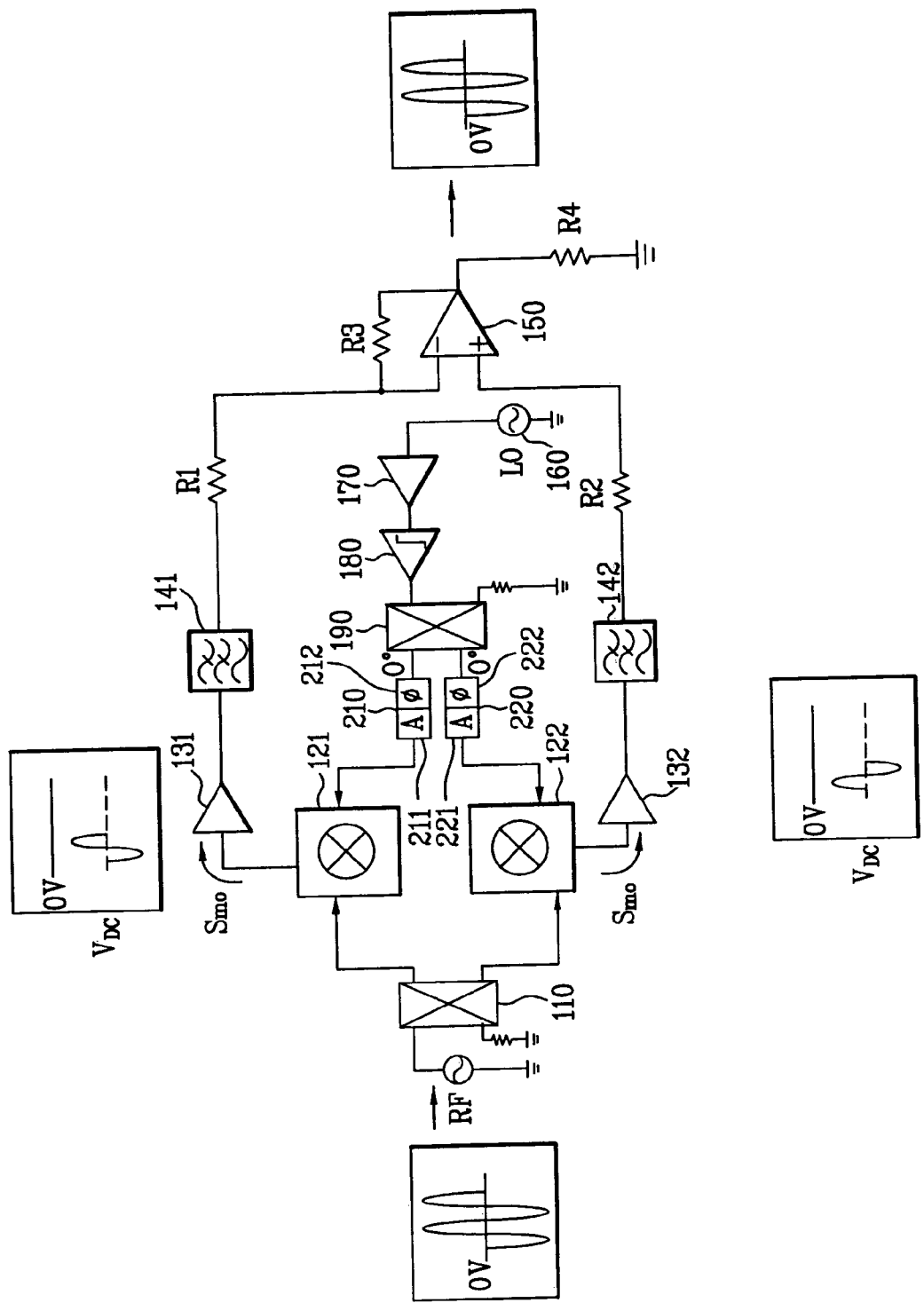
FIG. 2 is a circuit diagram of one example of a zero intermediate frequency transceiver according to the present invention.

FIG. 2 is a circuit diagram of one presently preferred example of a zero intermediate frequency transceiver constructed in accordance with the teachings of the present invention. As is shown in FIG. 2, the example zero intermediate frequency transceiver includes a power distributor 110 configured to distribute a radio frequency (RF) input signal into two output signals having 180° phase differences. The power distributor 110 is preferably implemented using a ring hybrid circuit, although other implementations could be used. A pair of double balanced mixers 121 and 122 are each configured to mix two input signals: a local signal that has passed through an equal phase directionality coupler 190 and an RF signal that has been divided as discussed above by passing through the power distributor 110. Each double balanced mixer 121 and 122 converts the two input signals into a single output signal centering on DC in downlink. A pair of baseband gain buffer amplifiers 131 and 132 is each configured to deliver the signals that are output from the double balanced mixers 121 and 122 to a low frequency subtraction circuit 150 without load effect. A pair of low pass filters 141 and 142 allows only the low frequency band signals output by the baseband gain buffer amplifiers 131 and 132 to pass through, and the low frequency subtraction circuit 150 receives signals passing through the low pass filters 141 and 142 and compares the sizes of the received signals.

An oscillation frequency output from a local oscillator 160 is delivered to the equal phase directionality coupler 190 via a buffer amplifier 170 and a limiter 180.

Correction circuits 210 and 220 are connected to the equal phase directionality coupler 190. Each of the correction circuits 210 and 220 includes a variable phase converter 212 or 222 and a variable attenuator 211 or 221 to finely adjust a phase and power level according to a control signal. The RF input signals that are input into the pair of double balanced mixers 121 and 122 are mixed with local signals that have passed through the correction circuits 210 and 220 after having been divided by the equal phase directionality coupler 190. The double balanced mixers 121 and 122 output signals centering on a DC in downlink. The output signals, which were mixed with the RF signals having 180° phase difference to be converted in downlink, on the two paths are equal to each other in a size of DC offset and have phases opposite to each other in signal to receive.

The baseband unit gain buffer amplifiers 131 and 132 are provided to rear ends of a pair of the double balanced mixers 121 and 122 to deliver the downlink-converted signals to the low frequency subtraction circuit 150 in a manner so as to minimize load effect.

When a local oscillation (LO) frequency signal generated from the local oscillator 160 is fed back to an RF input path via the pair of double balanced mixers 121 and 122, if the pair of double balance mixers 121 and 122 are identical, the leaking LO signals on the two paths will differ from each other in 180° phase. Therefore, if they are added to each other at the RF input end of the zero intermediate frequency transceiver, the leaking LO signals can be cancelled out. Moreover, to suppress an amplitude noise of the LO signal and to stabilize a gain variation occurring due to variation factors in an operational process, the LO limiter 180 is employed. Consequently, the amount of leakage of the local oscillation power can be reduced to an amount smaller than that of a general direct downlink conversion mixer and the DC offset can be substantially removed.

It is assumed that a desired signal $S_{wanted}(t)$ and an interference signal $S_{undesired}(t)$ have arbitrary phases, respectively, that a local oscillation signal $S_{local}(t)$ has a predetermined size and phase, and that a frequency difference between the wanted signal $S_{wanted}(t)$ and the interference signal $S_{undesired}(t)$ is much greater than a cutoff frequency of each of the low pass filters 141 and 142.

In this case, each value of the signals can be expressed as follows.

$$S_{wanted}(t) = m_1(t)\cos(\omega_1 t + \phi_1)$$

$$S_{undesired}(t) = m_2(t)\cos(\omega_2 t + \phi_2)$$

$$S_{local}(t) = A\cos(\omega_0 t + \phi_3)$$

The signals output from the double balanced mixers 121 and 122 can be expressed as follows.

$$S_{mixer-output} = a_1(S_{wanted}(t) + S_{undesired}(t)) + a_2 S_{local} +$$
$$a_3(S_{wanted}(t) + S_{undesired}(t))S_{local} +$$
$$a_4(S_{wanted}(t) + S_{undesired}(t))^2 + a_5 S_{local}(t)^2 \rightarrow S_{Lowpass-out} +$$
$$a_6(S_{wanted}(t) + S_{undesired}(t))S_{local}(t)^2 + a_7(S_{wanted}(t) + S_{undesired}(t))^2 S_{local} +$$
$$\backslash[NoBreak a_8(S_{wanted}(t) + S_{undesired}(t))^3 + a_9 S_{local}^3 +$$

high order harmonic terms

In this case, first and second terms represent values obtained from finite isolation characteristics at ports connected to the corresponding double balanced mixers, respectively. A third term indicates a wanted signal value. Values of fourth and fifth terms are values according to second order distortion at the corresponding double balanced mixers. Sixth, seventh and eighth terms represent values due to third order distortion.

Meanwhile, the wanted signal value represents a value obtained from performing sums of values through the corresponding low pass filter. A value of each of the low pass filters can be expressed as follows.

$$S_{Lowpass-out1} = \boxed{\frac{1}{2}a_5 A^2 + \frac{1}{2}a_4 m_1(t)^2 + \frac{1}{2}a_4 m_2(t)^2}^{(1)\quad(2)\quad(3)} - \boxed{a_3 m_1(t)\cos(\phi_1(t) - \phi_2(t))}^{(4)}$$

$$S_{Lowpass-out2} = \boxed{\frac{1}{2}a_5 A^2 + \frac{1}{2}a_4 m_1(t)^2 + \frac{1}{2}a_4 m_2(t)^2} + \boxed{a_3 m_1(t)\cos(\phi_1(t) - \phi_2(t))}$$

In these expressions, the value corresponding to a first term (1) of each expression is a DC component generated from each of the double balanced mixers 121 and 122 by a local oscillation signal. The second term (2) of each of the expressions represents a signal component generated from second order distortion of a local oscillation frequency. The third term (3) of each of the expressions represents a DC component of an interference signal generated from second order distortion of each of the double balanced mixers 121 and 122. The value of a fourth term (4) of each of the expressions indicates the wanted signal value.

A difference ($S_{lowpass-out2} - S_{lowpass-out1}$) between two signals can be calculated by the low frequency subtraction circuit 150 as follows.

$$S_{Lowpass-out} = S_{Lowpass-out2} - S_{Lowpass-out1} = 2a_3 m_1(t)\cos(\phi_1(t) - \phi_2(t))$$

In signals on two paths, the DC offsets are cancelled out by the low frequency subtraction circuit 150 and the wanted signals are added together. Primarily, the second order distortion and DC offset are reduced by the corresponding double balanced mixer. Thereafter, the DC offset, generated from the unbalanced characteristics of the devices used for the double balanced mixers instead of being cancelled out, is reduced again by the low frequency subtraction circuit 150.

Figure 3:
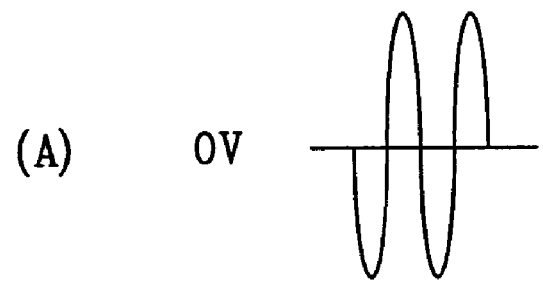
FIG. 3 is an exemplary diagram of signals appearing on the circuit diagram shown in FIG. 2.
Figure 3:
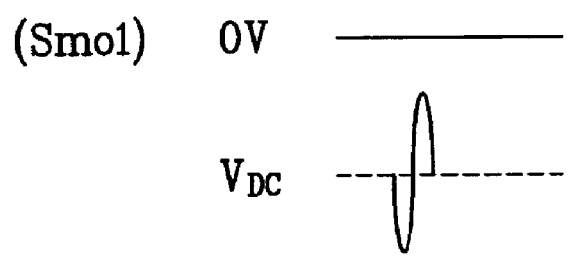
Figure 3:
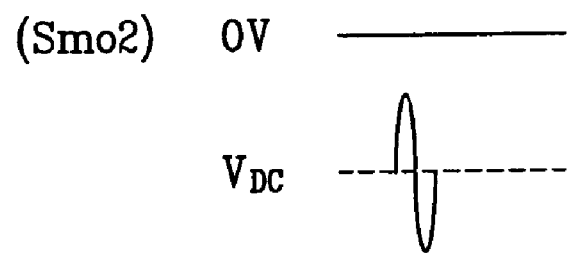
Figure 3:
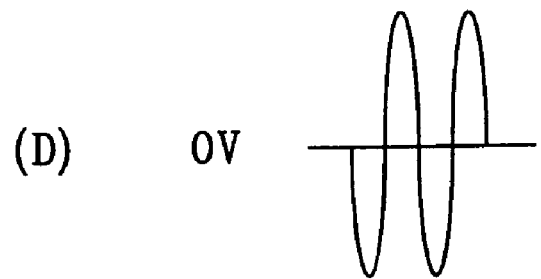

FIG. 3 is an exemplary diagram of signals appearing on the circuit diagram shown in FIG. 2. With reference now to FIG. 3, 'A' represents an RF signal that is being received, 'Smo1' and 'Smo2' represent downlink-converted signals obtained from mixing signals generated from dividing a signal into signals having 180° phase differences with local signals. The mixing is performed by the double balanced mixers 121 and 122, respectively. 'D' represents a signal obtained from removing DC offsets from signals delivered via signal delivery resistors R1 and R2 and the low pass filters 141 and 142 by the subtraction circuit 150 and from adding wanted signals together.

Accordingly, in an apparatus for frequency direct conversion reception in a mobile communication terminal and method thereof, the present invention reduces the leakage amount of the local oscillator power as well as removes the DC offsets.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of frequency direct conversion in a mobile communication terminal, the method comprising:
   a radio frequency distributing step of distributing a radio frequency input signal into two signals having 180° phase differences from each other by coupling;
   a local signal distributing step of distributing a local signal provided from a local oscillator into two signals having the same phase, the local signal distributing step further comprising a step of suppressing amplitude noise of the local signal;
   a signal mixing step of mixing the distributed radio frequency signals with the distributed local signals;
   an amplifying step of amplifying each of the mixed signals;
   a frequency band filtering step of allowing a low frequency band signal from each of the amplified signals to pass through in order to produce filtered signals; and
   a cancelling and adding step of canceling out DC offsets included in the filtered signals and adding a wanted signal.

2. The method as recited in claim 1, wherein the local signal distributing step further comprises the step of finitely adjusting the phase and power level of the distributed signals according to a control signal.

3. The method as recited in claim 2, wherein the signal mixing step further comprises the step of mixing the two distributed radio frequency signals and the two distributed local signals in order to convert in downlink centering on a DC.

4. An apparatus for frequency direct conversion reception in a mobile communication terminal, the apparatus comprising:
   a power distributor configured to distribute a single radio frequency input signal into two output signals having 180° phase differences by coupling;
   an equal phase directionality coupler configured to receive a single local signal provided by a local oscillator in order to distribute the single local signal into two output signals having the same phase;
   a limiter configured to suppress amplitude noise of the single local signal prior to being distributed into two output signals having the same phase by the equal phase directionality coupler;
   a pair of mixers, each configured to mix one of the two distributed local signals with one of the two distributed radio frequency signals in order to output a signal in downlink centering on a DC;
   a pair of baseband gain buffer amplifiers, each configured to deliver without load effect one of the two signals outputted from each of the pair of mixers to a rear end of the apparatus;
   a pair of pass filters, each configured to allow only low frequency band signals of the signals output by the pair of baseband gain buffer amplifiers to pass through; and
   a low frequency subtraction circuit configured to receive and compare the size of the signals that pass through the pair of pass filters.

5. The apparatus of claim 4, wherein the power distributor is a ring hybrid.

6. The apparatus of claim 4, wherein each of the pair of mixers is a double balanced mixer.

7. The apparatus of claim 4, wherein a pair of correction circuits is connected to the equal phase directionality coupler, where each of the pair of correction circuits is configured to adjust one of the two output signals of the equal phase directionality coupler before each of the two output signals is delivered to each of the pair of mixers.

8. The apparatus of claim 7, each of the pair of correction circuits comprising:
   a variable phase converter configured to convert a phase of the signal outputted by the equal phase directionality coupler according to a control signal; and
   a variable attenuator configured to finely adjust a power level of the signal converted by the variable phase converter in order to cope with a rear end circuit according to the control signal.

9. The apparatus of claim 4, wherein output signals of the pair of the mixers are equal to each other in size of DC offset and are opposite to each other in phase.

10. The apparatus of one of claims 4 to 9, wherein the low frequency subtraction circuit includes an operational amplifier.

11. The apparatus of one of claims 4 to 9, wherein the low frequency subtraction circuit includes a transformer.

* * * * *